(12) United States Patent
Nakajima et al.

(10) Patent No.: US 8,587,755 B2
(45) Date of Patent: Nov. 19, 2013

(54) DISPLAY APPARATUS

(75) Inventors: Yoshiharu Nakajima, Kanagawa (JP); Go Yamanaka, Kanagawa (JP)

(73) Assignee: Japan Display West, Inc., Chita (JP)

( * ) Notice: Subject to any disclaimer, the term of this patent is extended or adjusted under 35 U.S.C. 154(b) by 835 days.

(21) Appl. No.: 12/300,480

(22) PCT Filed: Mar. 14, 2008

(86) PCT No.: PCT/JP2008/054801
§ 371 (c)(1),
(2), (4) Date: Nov. 12, 2008

(87) PCT Pub. No.: WO2008/114749
PCT Pub. Date: Sep. 25, 2008

(65) Prior Publication Data
US 2009/0147191 A1    Jun. 11, 2009

(30) Foreign Application Priority Data

Mar. 16, 2007  (JP) ................................. 2007-069474

(51) Int. Cl.
*G02F 1/133*  (2006.01)
(52) U.S. Cl.
USPC .......................................... 349/116; 349/151
(58) Field of Classification Search
USPC ................................................ 349/116, 151
See application file for complete search history.

(56) References Cited

U.S. PATENT DOCUMENTS

| | | | |
|---|---|---|---|
| 6,177,214 B1 * | 1/2001 | Yokoyama et al. | 430/7 |
| 6,522,395 B1 | 2/2003 | Bamji et al. | |
| 7,626,575 B2 * | 12/2009 | Cho et al. | 345/173 |
| 2002/0036275 A1 | 3/2002 | Fukuzaki | |
| 2002/0175888 A1 * | 11/2002 | Murade | 345/92 |
| 2004/0085611 A1 * | 5/2004 | Minoura et al. | 359/263 |
| 2004/0113877 A1 | 6/2004 | Abileah et al. | |
| 2004/0189621 A1 * | 9/2004 | Cho et al. | 345/179 |
| 2004/0252867 A1 * | 12/2004 | Lan et al. | 382/124 |
| 2005/0200293 A1 | 9/2005 | Naugler et al. | |
| 2005/0275616 A1 * | 12/2005 | Park et al. | 345/102 |
| 2006/0139334 A1 * | 6/2006 | Van Delden et al. | 345/173 |
| 2007/0013646 A1 | 1/2007 | Harada et al. | |
| 2007/0046650 A1 | 3/2007 | Lee et al. | |
| 2008/0138013 A1 * | 6/2008 | Parriaux | 385/37 |
| 2009/0033638 A1 * | 2/2009 | Yamaguchi et al. | 345/176 |
| 2010/0040324 A1 * | 2/2010 | Mappes et al. | 385/14 |

FOREIGN PATENT DOCUMENTS

| | | |
|---|---|---|
| JP | H11-134105 | 5/1999 |
| JP | 2002-041244 | 2/2002 |
| JP | 2002-149085 | 5/2002 |

(Continued)

*Primary Examiner* — Kaveh Kianni
(74) *Attorney, Agent, or Firm* — Robert J. Depke; The Chicago Technology Law Group, LLC

(57) ABSTRACT

A liquid crystal display apparatus having little influence of noise and able to improve an SN ratio of a light reception system without requiring a calibration operation when turning on the power, is provided. The apparatus has a plurality of display cells 21 having display circuits 210, light receiving cells 22 each including a light receiving element 221, a reference cell 23 having a configuration equivalent to the configuration of the light receiving cell and blocked from incidence of a light upon the light receiving element 221, and a received light signal processing circuit 6 performing differential signal processing of an output signal of the light receiving cell 22 and an output signal of the reference cell 23 and deleting noise.

6 Claims, 10 Drawing Sheets

(56) References Cited

FOREIGN PATENT DOCUMENTS

| | | | |
|---|---|---|---|
| JP | 2004-318067 | | 11/2004 |
| JP | 2004-318819 | * | 11/2004 |
| JP | 2005-347537 | | 12/2005 |
| JP | 2007-047991 | | 2/2007 |
| JP | 2007-058552 | | 3/2007 |

* cited by examiner

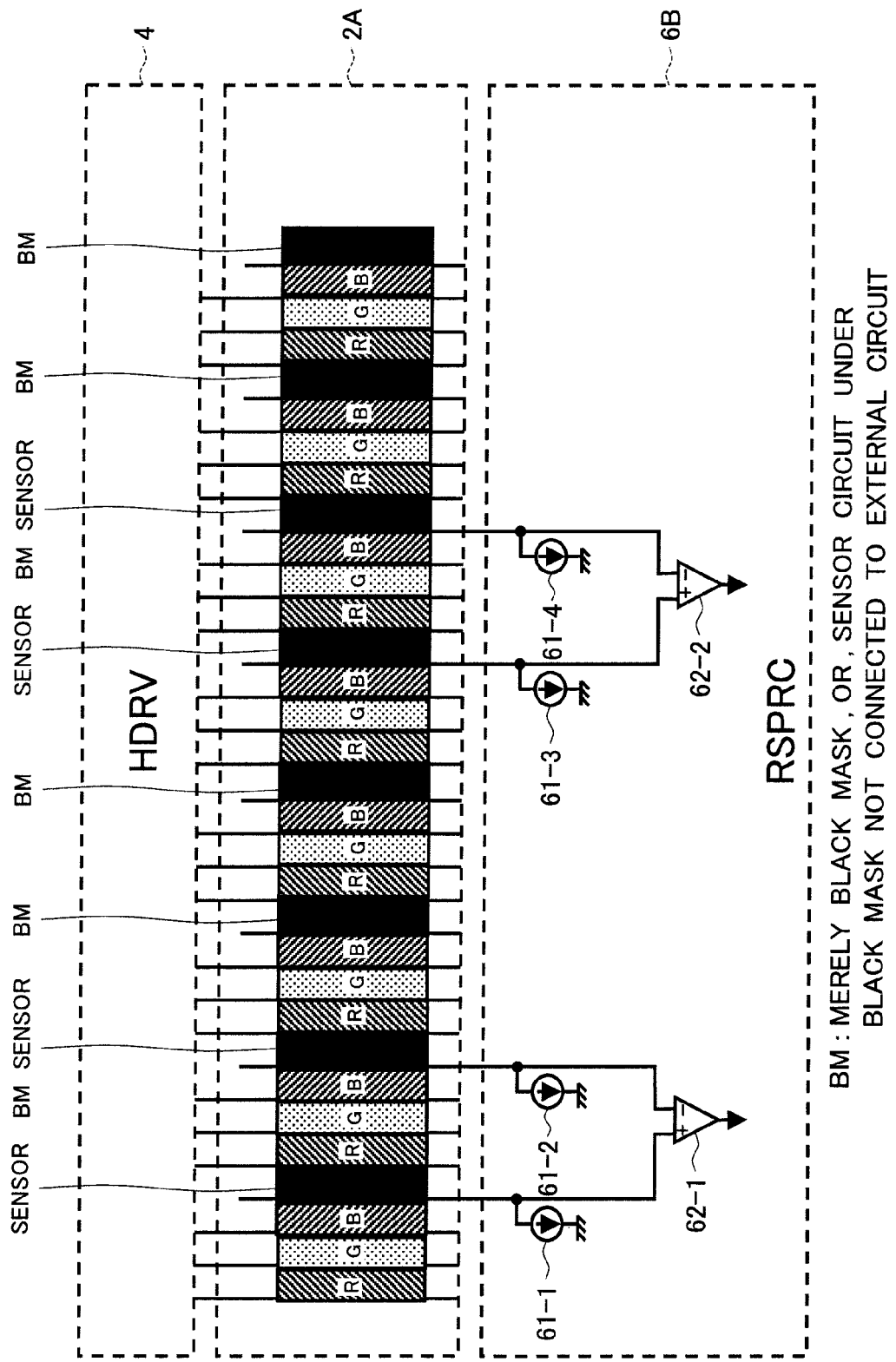

DISPLAY APPARATUS

This application is a 371 U.S. National Stage filing of PCT/JP2008/054801, filed Mar. 14, 2008, which claims priority to Japanese Patent Application Number 2007-069474 filed Mar. 16, 2007, all of which are incorporated herein by reference.

TECHNICAL FIELD

The present invention relates to a display apparatus provided with a light receiving element in a display pixel portion or on a frame of the display pixel portion.

BACKGROUND ART

Several techniques providing coordinate input functions in display apparatuses themselves have been proposed.

Specifically, for example, a display apparatus using a pressure sensitive type touch panel system (see, for example, Patent Documents 1 and 2) and a display apparatus using an electromagnetic induction type touch panel system (see, for example, Patent Document 3) are known.

However, a display apparatus having coordinate input function means as described above, had the problems that miniaturization was difficult, and costs became higher in comparison with ordinary display apparatuses.

Therefore, in recent years, there have been being actively developed display apparatuses for overcoming the above problem, in which a light receiving element is provided to each pixel of the display apparatus, and incident light upon the light receiving element is detected to specify coordinates inside the display apparatus (see Patent Documents 4 and 5).

An apparatus providing light receiving elements so as to enable input of coordinates in a display apparatus as described above, not only has the advantage that the size can be reduced and costs can be lowered in comparison with a display apparatus provided with a coordinate input function means, but also enables multi-point coordinate input and area input.

Patent Document 1: Japanese Patent Publication (A) No. 2002-149085
Patent Document 2: Japanese Patent Publication (A) No. 2002-41244
Patent Document 3: Japanese Patent Publication (A) No. H11-134105
Patent Document 4: Japanese Patent Publication (A) No. 2004-318067
Patent Document 5: Japanese Patent Publication (A) No. 2004-318819

DISCLOSURE OF INVENTION

Problem to be Solved by the Invention

However, in a system utilizing light reflected from back light of a detection object, such as, a finger and realizing a touch panel, an image sensor, etc., it suffers from the disadvantage that noise of the reflected light inside the display apparatus cannot be canceled in real time.

Further, in the system using back light described above or an imaging system using external light, interference noise from a display portion cannot be canceled in real time.

Further, for such reasons stated above, a high reliability system having strong tolerance for temperature characteristics and time fluctuations, cannot be realized.

Further, if realizing and using a high reliability system, a calibration operation becomes necessary when turning on the power.

The present invention provides a display apparatus able to reduce the influence by noise and able to improve an SN ratio of a light receiving system without requiring a calibration operation when turning on the power.

Means for Solving the Problem

A display apparatus of a first aspect of the present invention has at least one display cell having a display circuit; at least one light receiving cell including a light receiving element; at least one reference cell having a configuration equivalent to the configuration of the light receiving cell and blocked from incidence of light upon the light receiving element; and a signal processing circuit performing differential signal processing of an output signal of the light receiving cell and an output signal of the reference cell.

A second aspect of the present invention has an effective pixel area portion in which a plurality of display cells are arrayed in a matrix and in which at least one light receiving cell including a first light receiving element and at least one reference cell having a configuration equivalent to the configuration of the light receiving cell and blocked from incidence of light upon a second light receiving element are arranged mixed in the matrix array of the display cells; a signal processing circuit performing differential signal processing of an output signal of the light receiving cell and an output signal of the reference cell; and a back light emitting light to the effective pixel area portion.

In the present invention, an output signal of a light receiving cell including, for example, a light component to be detected and a noise component and an output signal of a reference cell not including the light component to be detected, but including only a noise component, are input to the signal processing circuit to process the differential signal processing, to thereby delete the noise component.

Advantageous Effects

According to the present invention, the influence by noise can be reduced, and the SN ratio of the light receiving system can be improved without requiring a calibration operation when turning on the power.

BRIEF DESCRIPTION OF DRAWINGS

FIG. 10 A diagram for explaining an example of another cell array.

BEST MODE FOR CARRYING OUT THE INVENTION

Below, an embodiment of the present invention will be explained with reference to the attached drawings.

In the following description, first, the basic configuration and functions of a liquid crystal image display apparatus providing a light receiving element for each display pixel will be explained for facilitating understanding, then an embodiment according to a concrete structure will be explained.

Figure 1:
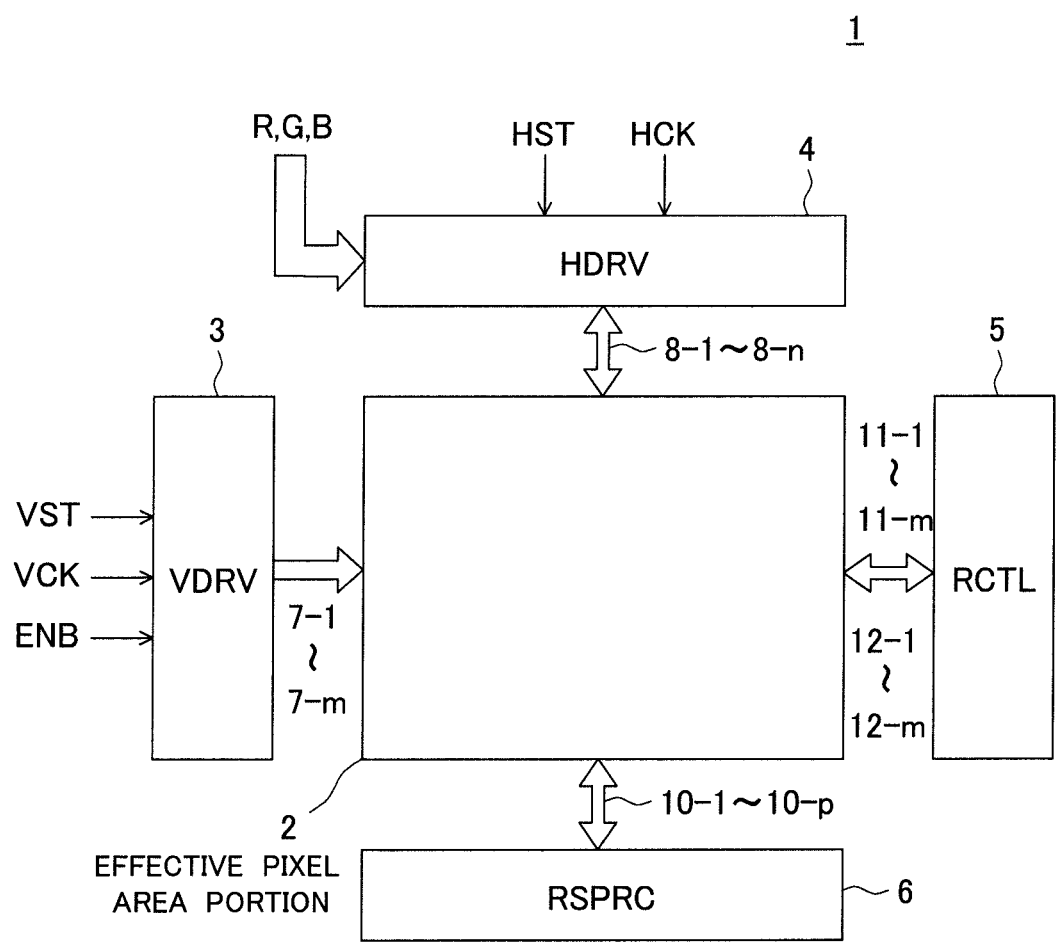
FIG. 1 A block diagram showing an example of the configuration of a liquid crystal image display apparatus according to an embodiment of the present invention.

FIG. 1 is a block diagram showing an example of the configuration of a liquid crystal image display apparatus according to the embodiment of the present invention.

FIGS. 2(A) to 2(C) are diagrams showing a first example of the configuration of an effective pixel area portion in the liquid crystal image display apparatus of FIG. 1, in which FIG. 2(A) shows a matrix of cells, FIG. 2(B) shows a plan view, and FIG. 2(C) shows a sectional view.

A liquid crystal image display apparatus 1, as shown in FIG. 1, has an effective pixel area portion 2, vertical drive circuit (VDRV) 3, horizontal drive circuit (HDRV) 4, light reception control circuit (RCTL) 5, and received light signal processing circuit (RSPRC) 6.

Figure 2:
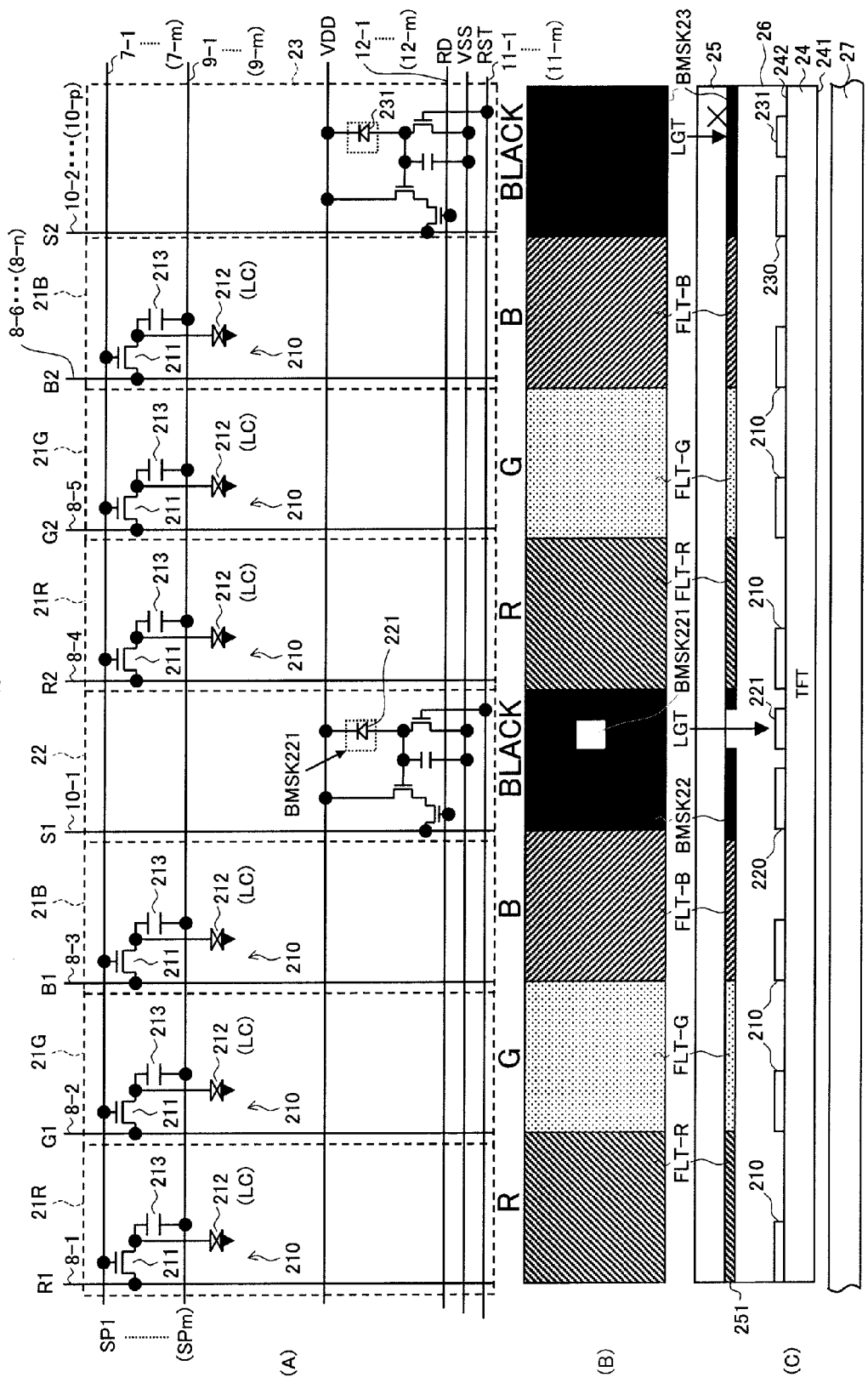
FIG. 2 Diagrams showing a first example of the configuration of an effective pixel area in the liquid crystal image display apparatus of FIG. 1.

In the effective pixel area portion 2, as shown in FIG. 2, a plurality of display cells 21 (21R, 21G, 21B), each including a display circuit 210 forming a display pixel, are arranged in a matrix.

Further, in the effective pixel area 2, a light receiving cell 22 and a reference cell 23 are alternately arranged for each adjacent three display cells 21R, 21G, and 21B.

Specifically, from the left in FIG. 2 to the right, a R color display cell 21R, G color display cell 21G, and B color display cell 21B, corresponding to the three primary colors, are arranged, and the light receiving cell 22 is arranged adjacent to the display cell 21B. Further, following this light receiving cell 22, the R color display cell 21R, G color display cell 21G, and B color display cell 21B are arranged, and the reference cell 23 is arranged adjacent to this display cell 21B. The effective pixel area portion 2 of the first example of the configuration is formed by this array being periodically repeated.

In such array, a pair of closely arranged the light receiving cell 22 and the reference cell 23 (the light receiving cell 22 and the reference cell 23 are closely arranged close while sandwiching the display cells 21R, 21G, and 21B between them, and close in positional relationship of the light receiving cell 22 and the reference cell 23), perform differential processing of outputs as the pair of the cells. As a result, noise is eliminated.

Further, in the effective pixel area portion 2, as shown in FIG. 2(B), an R color filter FLT-R is formed in the arrangement region of the display R color display cell 21R, a G color filter FLT-G is formed in the arrangement region of the G color display cell 21G, and a B color filter FLT-B is formed in the arrangement region of the B color display cell 21B.

A black mask (light shield mask) BMSK22 having a light shield function is formed in the arrangement region of the light receiving cell 22, and a black mask (light shield mask) BMSK23 having a light shield function is formed in the arrangement region of the reference cell 23.

In the black mask BMSK22 formed in the light receiving cell 22, an opening BMSK221 for receiving light into the light receiving element is formed.

Contrary to this, in the black mask BMSK23 formed in the reference cell 23, an opening corresponding to the opening BMSK221 is not formed.

In the effective pixel area portion 2, as shown in FIG. 2(C), a liquid crystal layer 26 is formed between a TFT substrate (first transparent substrate) 24 formed by, for example, glass and a counter substrate (second transparent substrate 25) by sealing liquid crystal therebetween. Further, a back light 27 is arranged on, for example, a bottom surface 241 side of the TFT substrate 24.

Further, on a base surface 242 side of the TFT substrate 24, the display circuits 210 for the display cells 21R, 21G, and 21B, a read circuit 220 and a light receiving element (photo sensor) 221 for the light receiving cell 22, and a read circuit 230 and a light receiving element (photo sensor) 231 for the reference cell 23, are formed.

On the other hand, on a base surface 251 of the counter substrate 25, various types of filters FLT-R, FLT-G, and FLT-B, and black masks BMSK22 and BMSK23, are formed.

The display circuit 210 in each display cell 21 is configured by, as shown in FIG. 2(A), a thin film transistor (TFT) 211 as a switching element, a liquid crystal cell (LC) 212 of which pixel electrode are connected to a drain electrode (or source electrode) of the TFT 211, and a holding capacitor (Cs) 213 of which one electrode is connected to the drain electrode of the TFT 211.

For these display cells 21R, 21G, and 21B, scanning lines (gate lines) 7-1 to 7-*m* are wired for each row along the pixel arrangement direction, and signal lines 8-1 to 8-*n* are wired for each column along the pixel arrangement direction.

Further, gate electrodes of the TFTs 211 of the display cells 21 are connected to the same scanning lines (gate lines) 7-1 to 7-*m* in units of rows. Further, source electrodes (or drain electrodes) of the TFTs 211 of the display cells 21 are connected to the same display signal lines 8-1 to 8-*n* in units of columns.

In the configuration of FIG. 2(A), the scanning lines 7-1 to 7-*m* are connected to the vertical drive circuit 3 and driven by this vertical drive circuit 3.

Further, the display signal lines 8-1 to 8-*n* wired corresponding to the display cells 21 are connected to a horizontal drive circuit 4, and driven by this horizontal drive circuit 4.

Pixel holding capacitor wirings (Cs) 9-1 to 9-*m* are independently wired. The holding capacitors 213 are formed between these pixel holding capacitor wirings 9-1 to 9-*m* and connection electrodes.

To the counter electrode of the liquid crystal cell 212 of the display cell 21 of each pixel portion 20 and/or the other electrode of the holding capacitor 213, for example, a predetermined DC voltage is given as a common voltage VCOM through a common wiring. Or, to the counter electrode of the liquid crystal cell 212 of each display cell 21 and the other electrode of the holding capacitor 213, for example, a common voltage VCOM inverted in polarity for each horizontal scanning period (1H), is given.

Further, in the effective pixel area portion 2, light reception signal lines 10-1 to 10-*p* (p<n) are wired at intervals of four lines corresponding to the light receiving cells 22 and the reference cells 23.

The light reception signal lines 10-1 to 10-*p* are connected to the received light signal processing circuit 6, and carry signals read out under the control of the light reception control circuit 5 to the received light signal processing circuit 6.

The vertical drive circuit 3 receives a vertical start signal VST, vertical clock VCK, and enable signal ENB, and carries out the processings of scanning in the vertical direction (row direction) for each 1 field period, and sequential selection of the display cells 21 connected to the scanning lines 7-1 to 7-*m* in units of rows.

When a scanning pulse SP1 is given from the vertical drive circuit 3 to the scanning line 7-1, the pixels of the columns in the first row are selected, while when a scanning pulse SP2 is given to the scanning line 7-2, the pixels of the columns in the second row are selected. Below, in the same way, scanning pulses SP3, . . . , SPm are sequentially given to the scanning lines 7-3, . . . , 7-*m*.

The horizontal drive circuit 4 receives a horizontal start pulse HST generated by a not shown clock generator and instructing the start of horizontal scanning and horizontal clocks HCK having inverse phases to each other and serving as the reference of the horizontal scanning, generates sampling pulses, sequentially samples input image data R (red), G (green), and B (blue) in response to the generated sampling pulses, and supplies the sampled results as data signals to be written into the display cells 21 to the display signal lines 8-1 to 8-*n*.

First light reception cell control lines (reset signal lines) 11-1 to 11-*m* and second light reception cell control lines (read signal lines) 12-1 to 12-*m* are wired for each row along the pixel arrangement direction thereof for each of the light receiving cells 22 and the reference cells 23.

Further, the light receiving cells 22 and the reference cells 23 are connected to portions of a power supply potential VDD and a reference potential VSS.

Figure 3:
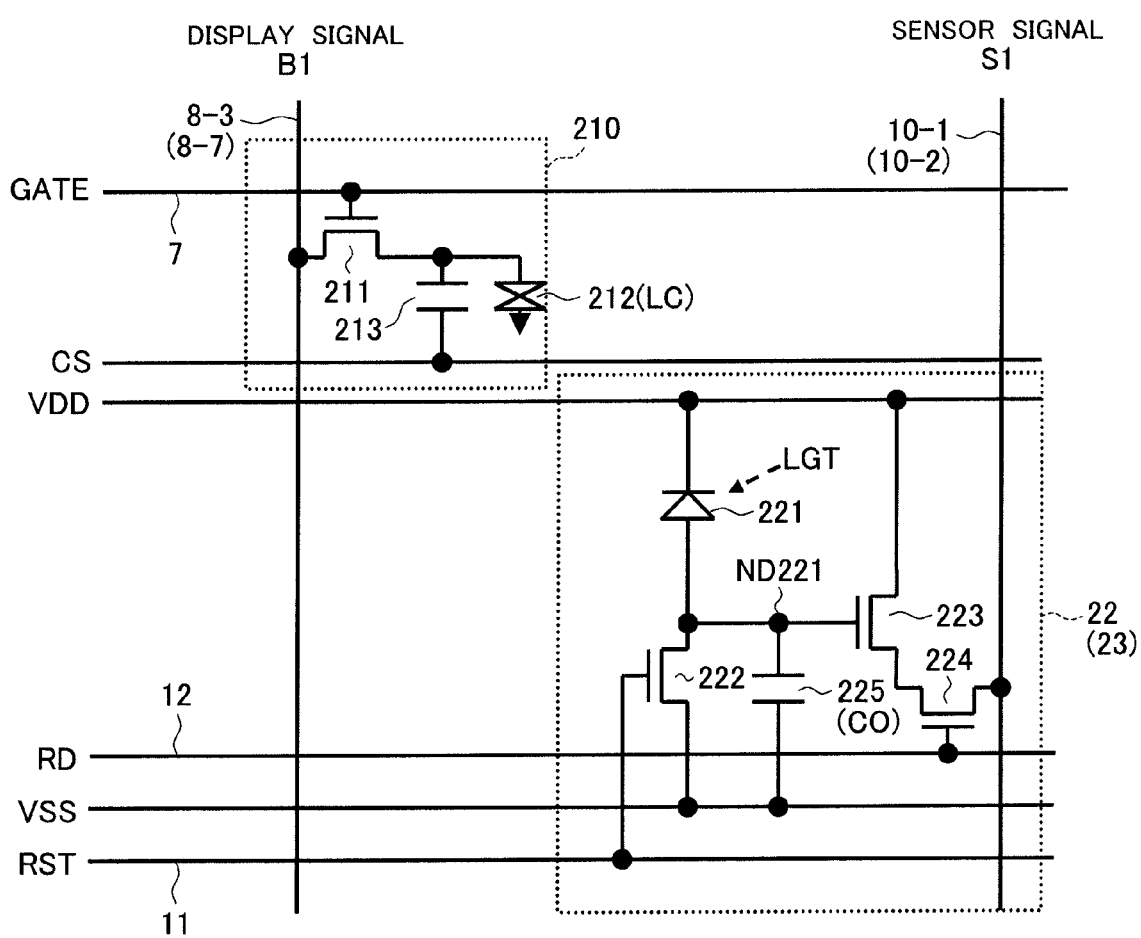
FIG. 3 A circuit diagram showing an example of the basic configuration of a light receiving cell (reference cell) according to the present embodiment.

FIG. 3 is a circuit diagram showing an example of the basic configuration of a light receiving cell 22 (reference cell 23) according to the present embodiment and shows a circuit of FIG. 2(A) in an enlarged view. Note that, in FIG. 3, the display circuit 210 of an adjacent display cell is shown together.

The light receiving cell 22 of the present embodiment has a light receiving element 221. The light receiving element 221 is formed by a TFT, diode, etc.

The read circuit 220 (230) of the light receiving cell 22 (reference cell 23) has a reset TFT 222 (232), amplification TFT 223 (233), selection (read) TFT 224 (234), received light signal storage capacitor 225 (235), and node ND221 (231).

The light receiving element 221 is connected between the portion of the power supply potential VDD and the node ND221. The reset TFT 222 is formed by, for example, an n-channel transistor, its source is connected to the portion of the reference potential VSS (for example, ground GND), and its drain is connected to the node ND221. Further, the gate electrode of the reset TFT 222 is connected to the first light reception cell control line 11 wired in the corresponding row.

The gate of the amplification TFT 223 is connected to the node ND221, its drain is connected to the portion of the power supply potential VDD, and its source is connected to the drain of the selection TFT 224. The gate of the selection TFT 224 is connected to the second light reception signal control line 12, and its source is connected to the light reception signal line 10 wired in the corresponding column.

These amplification TFT 223 and selection TFT 224 form a so-called "source follower". Accordingly, a current source is connected to the light reception signal line 10. This current source is formed in, for example, the received light signal processing circuit 6 in the present embodiment.

The received light signal storage capacitor 225 is connected between the node ND221 and the portion of the reference potential VSS.

Figure 4:
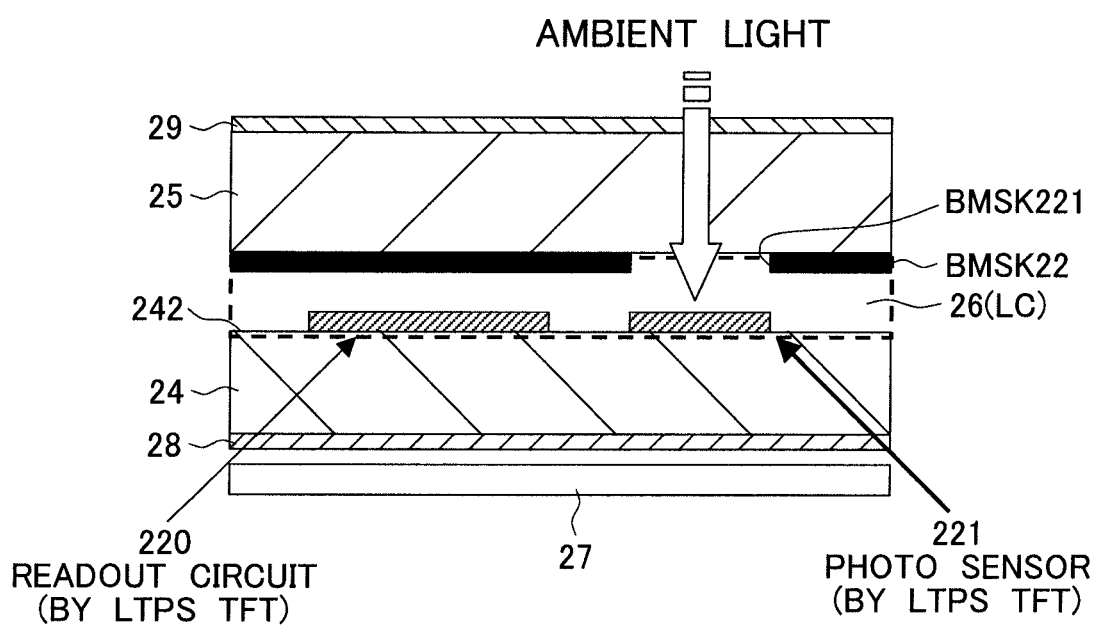
FIG. 4 A sectional view schematically showing a light receiving cell according to the present embodiment.

FIG. 4 is a cross-sectional view schematically showing a light receiving cell according to the present embodiment, and shows a portion of the light receiving cell of FIG. 2(C) in an enlarged view.

The light receiving cell 22 is, as shown in FIG. 4, formed on the base surface 242 side of the TFT substrate 24 formed by a transparent insulating substrate (for example, a glass substrate). The light receiving cell 22 is configured by the read circuit 220 and the light receiving element (photo sensor) 221.

The black mask BMSK22 is formed on the base surface 251 side of the counter substrate 25 formed by a counter substrate transparent insulating substrate (for example, a glass substrate). The opening BMSK221 guiding external light to the photo sensor 221 is formed in the black mask BMSK22 facing the region of formation of the photo sensor 221.

The liquid crystal layer 26 is sealed between the TFT substrate 24 and the counter substrate 25. Further, the back light 27 is arranged on the bottom surface 241 side of the TFT substrate 24.

A polarizing filter 28 is formed on the bottom surface 241 of this TFT substrate 24, and a polarizing filter 29 is formed on a front surface (light incident surface) 252 of the counter substrate 25.

Figure 5:
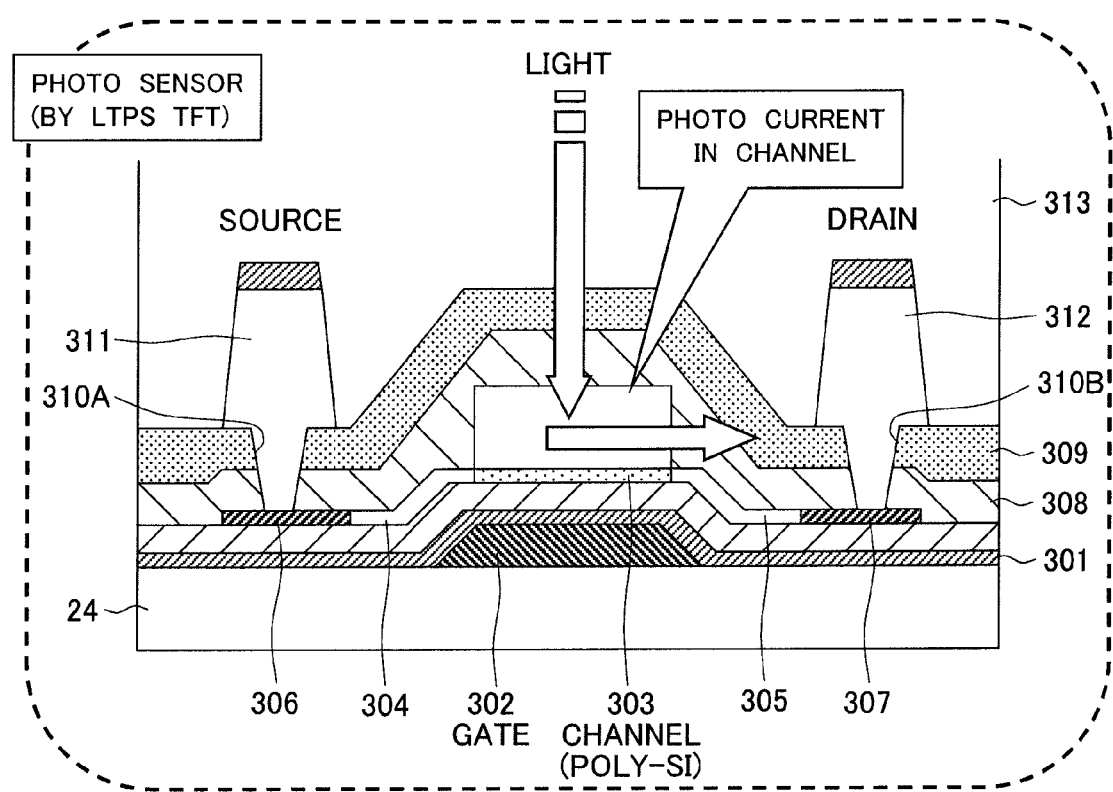
FIG. 5 A sectional view showing an example of the structure forming a photo sensor (light receiving element) of a light receiving cell and reference cell by a TFT.

FIG. 5 is a sectional view showing an example of the structure forming a photo sensor (light receiving element) of a light receiving cell and reference cell by a TFT.

A gate electrode 302 covered by a gate insulating film 301 is formed on the TFT substrate 24 (transparent insulating substrate, for example, a glass substrate). The gate electrode is formed by formation of a film of molybdenum (Mo), tantalum (Ta), or another metal or an alloy by sputtering or another process.

On the gate insulating film 302, a semiconductor film (channel forming region) 303, a pair of n⁻ diffusion layers (LDD regions) 304 and 305, sandwiching the semiconductor film 303, and a pair of n⁺ diffusion layers 306 and 307 (source and drain regions), are formed. Further, an interlayer insulating film 308 is formed so as to cover the gate insulating film 302, semiconductor layer (channel forming region) 303, n⁻ diffusion layers (LDD regions) 304 and 305, and n⁺ diffusion layers 306 and 307 (source and drain regions), and an interlayer insulating film 309 is formed so as to cover the interlayer insulating film 308. The interlayer insulating film 309 is formed by, for example, SiN or SiO₂.

To the n⁺ diffusion layer 306, a source electrode 311 is connected via a contact hole 310*a* formed in the interlayer insulating films 308 and 309, and to the other n⁺ diffusion layer 307, a drain electrode 312 is connected via a contact hole 310*b* formed in the interlayer insulating films 308 and 309.

The source electrode 311 and the drain electrode 312 are formed by patterning, for example, aluminum (Al).

A flattening film 313 is formed on the interlayer insulating film 309, source electrode 311, drain electrode 312, and interlayer insulating film 309.

The liquid crystal layer 26 is formed on this flattening film 313.

In this constitution, the gate electrode of the bottom gate type TFT is formed on an optical path of the light of the back light to the channel region of the TFT. Accordingly, the TFT gate electrode has a function of blocking the light from the back light 27, and has a function of reducing the noise beam.

The first light reception cell control line 11 and the second reception signal line 12 are connected to the light reception control circuit 5.

The light reception control circuit 5 applies a reset pulse RST to the light reception cell control lines 11-1 to 11-m at a predetermined timing.

Due to this, the reset TFT 222 of each display cell 22 turns on for a constant period, and the node ND221 is reset. In other words, in the display cell 22, for example, the charge of the received light signal storage capacitor 225 connected to the node ND221 is discharged, the potential of the node ND221 is set at the reference potential, and the light receiving cell 22 becomes an initial state.

In this state, when the light receiving element 221 receives a predetermined amount of light, the light receiving element 221 becomes conductive, the potential of the node ND221 rises, and a charge is stored in the capacitor 225.

At this time, by the light reception control circuit 5, the read signal RD is applied to the second light reception cell control line 12 at a high level, and the selection TFT 224 is held in an ON state. Due to this, the charge stored in the capacitor 225 is amplified as an electric signal at the amplification TFT 223 and output as a light reception signal to the light reception signal line 10 via the selection TFT 224.

A signal propagated through the light reception signal line 10 is input to the received light signal processing circuit 6. The received light signal processing circuit 6, as will be explained later, carries out a noise reduction processing by differential signal processing to the signal from the light receiving cell 22 and the signal from the reference cell 23, then outputs the result to a not shown signal processing system provided in a subsequent stage that controls a predetermined function portion responded to the input light reception signal of the light receiving cell 22.

Figure 6:
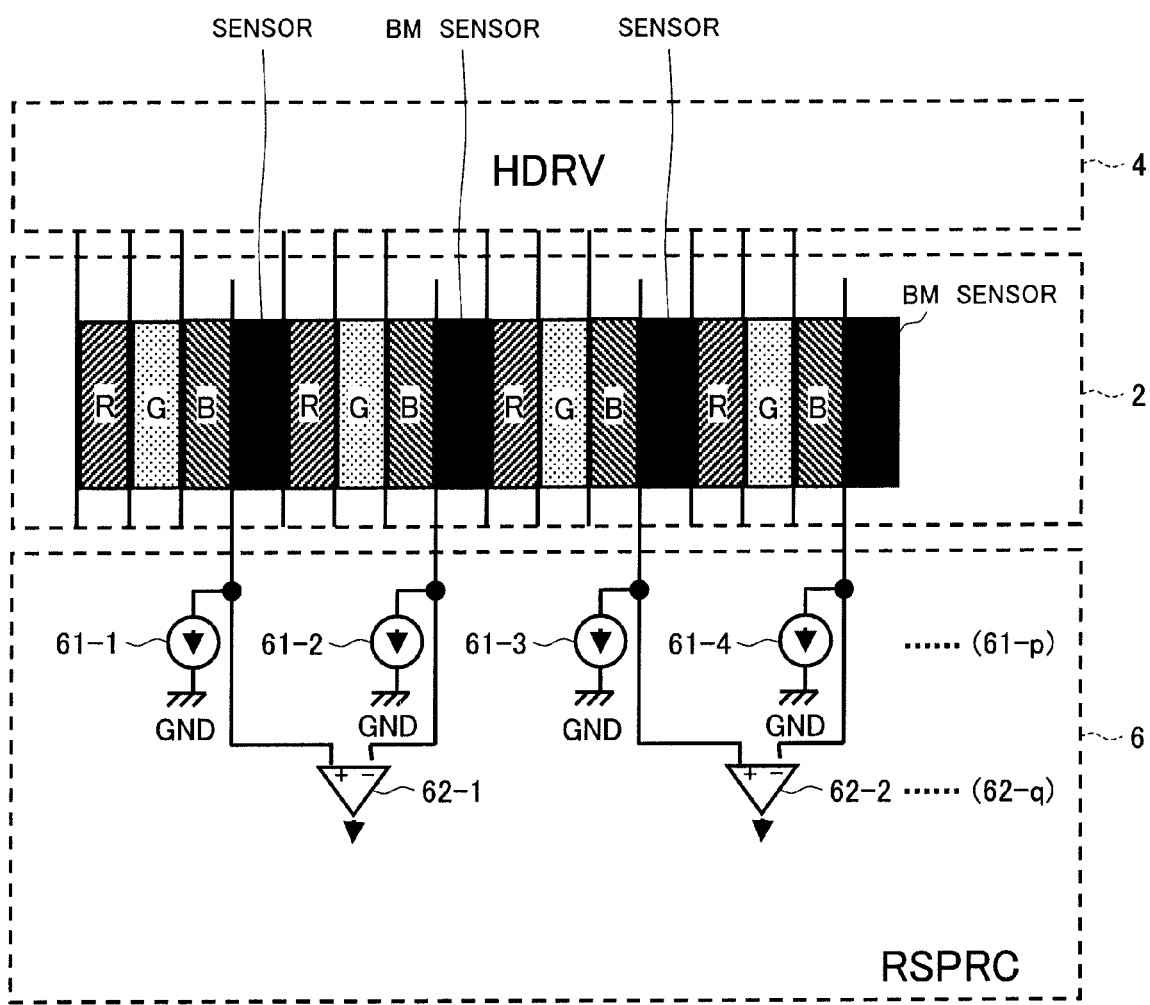
FIG. 6 A circuit diagram showing a first example of the configuration of a received light signal processing circuit according to the present embodiment.

FIG. 6 is a circuit diagram showing a first example of the configuration of the received light signal processing circuit according to the present embodiment.

Figure 7:
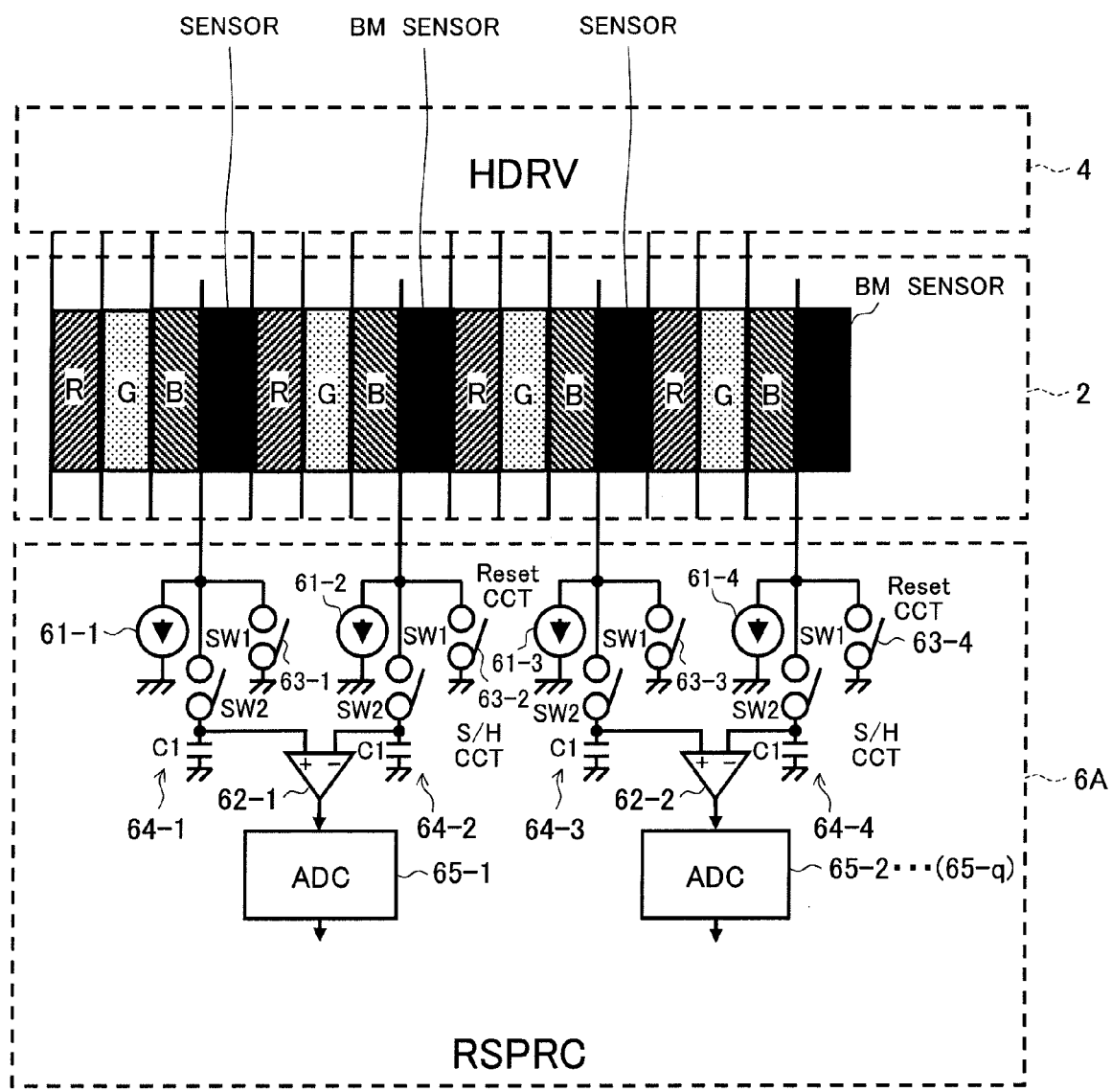
FIG. 7 A circuit diagram showing a second example of the configuration of the received light signal processing circuit according to the present embodiment.

FIG. 7 is a circuit diagram showing a second example of the configuration of the received light signal processing circuit according to the present embodiment.

The received light signal processing circuit 6 of FIG. 6 has current sources 61-1 to 61-$p$ connected to light reception signal lines 10-1 to 10-$p$ to which light receiving cells 22 and reference cells 23 are connected, and operational amplifiers 62-1 to 62-$q$ ($q=p/2$) performing differential signal processing (differential processing) of adjacent light reception signal lines 10-1 and 10-2 and outputting the resultant received light signal which suppresses the influence of reflection noise and offset noise in the light receiving cell 22 to an extremely small level.

Each operational amplifier 62 inputs the output signal of the light receiving cell 22 at a non-inverted input (+), inputs the output signal of the reference cell 23 adjacent to this light receiving cell 22 at an inverted input (−), performs differential processing of the two input signals, and outputs the resultant signal, suppressed the influence of reflection noise and offset noise in the light receiving cell 22 to an extremely small level, to the processing circuit in the subsequent stage.

A received light signal processing circuit 6A of FIG. 7, in addition to the circuit configuration of FIG. 6, has reset circuits 63-1 to 63-$p$ including switches SW1 and resetting the light reception signal lines 10-1 to 10-$p$ to which the light receiving cells 22 and reference cells 23 are connected to a predetermined voltage (ground potential (GND) in the example of FIG. 7), sample/hold circuits 64-1 to 64-$p$ configured by switches SW2 and capacitors C1 and connected between the light reception signal lines 10-1 to 10-$p$ and non-inverted inputs (+) and inverted inputs (−) of the operational amplifiers 62-1 to 62-$q$, and analog-to-digital converters (ADC) 65-1 to 65-$q$ connected to the outputs of the operational amplifiers 62-1 to 62-$q$ and converting analog signals to digital signals.

Note that, the differential signal processing in the received light signal processing circuit 6 (6A) may be analog differential processing or digital differential processing.

Next, how to obtain the signal to which the influence of reflection noise and offset noise in the light receiving cell 22 is suppressed in an extremely small level, by the differential signal processing of the output signal of the light receiving cell 22 and the output signal of the reference cell 23.

Figure 8:
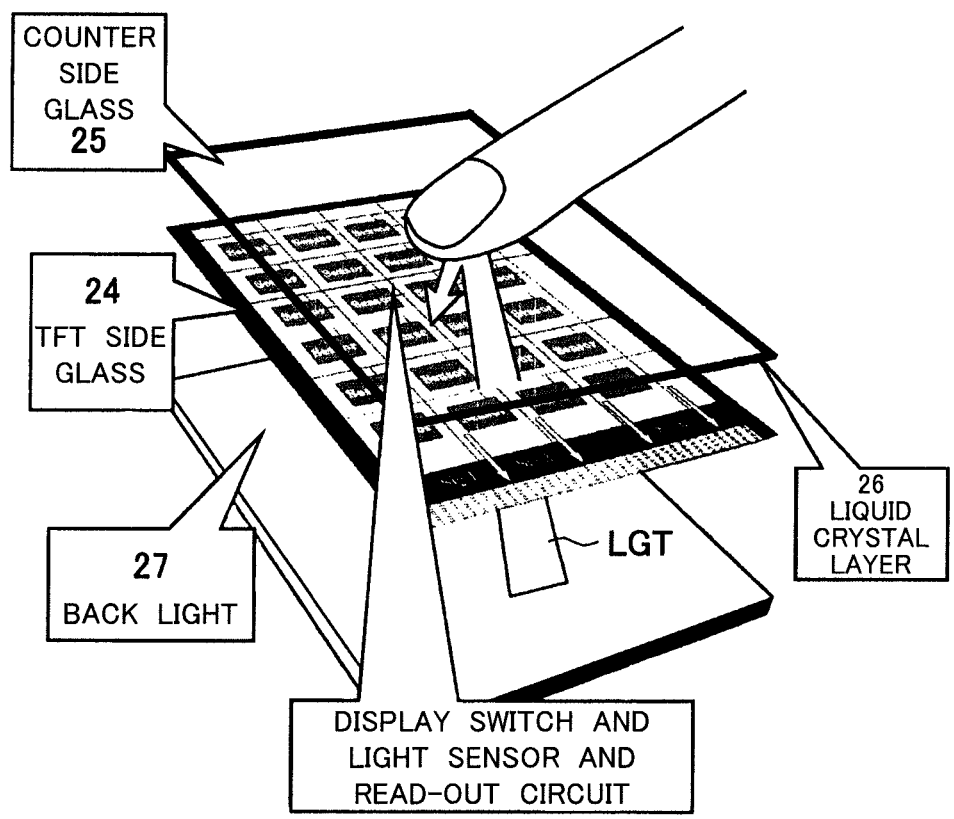
FIG. 8 A diagram schematically showing a detection system of reflected light of a back light.

Here, as shown in FIG. 8, an explanation will be given with reference to the case where the system is configured as a detection system of the reflected light of back light.

Figure 9:
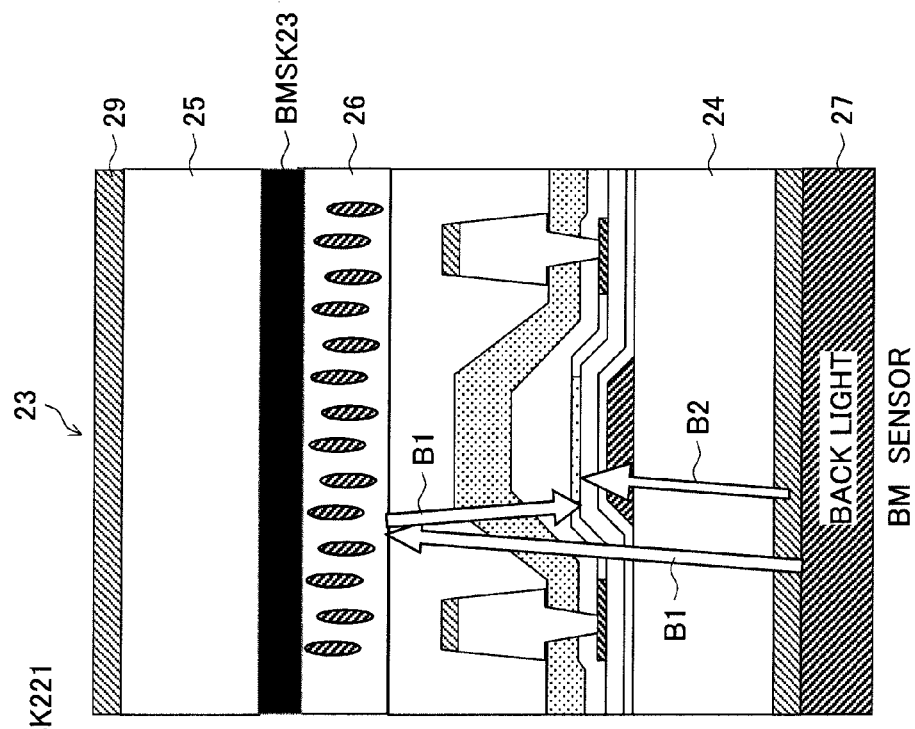
FIG. 9 Diagrams for explaining a reason why noise can be deleted by differential signal processing of output signals of the light receiving cell and the reference cell according to the present embodiment.
Figure 9:
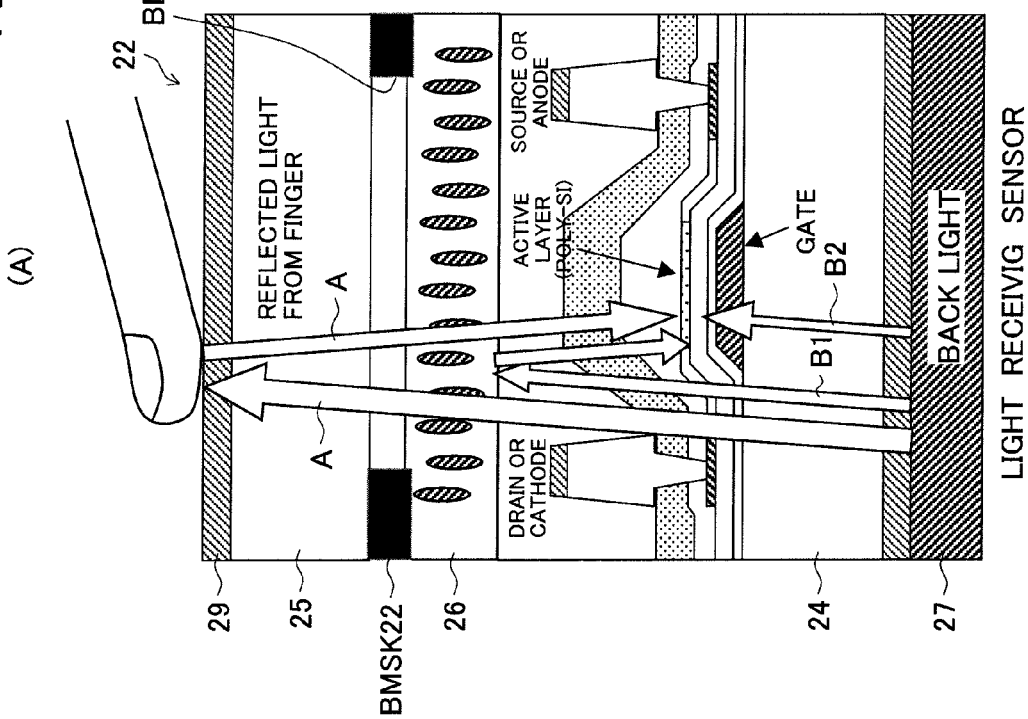

FIGS. 9(A) and 9(B) are diagrams for explaining a reason why noise can be deleted by the differential signal processing of output signals of the light receiving cell and reference cell according to the present embodiment, in which FIG. 9(A) is a diagram showing a state of the light receiving cell, and FIG. 9(B) is a diagram showing a state of the reference cell.

In FIGS. 9(A) and 9(B), an arrow A indicates the light to be detected, and an arrow B indicates a noise beam.

In the light receiving cell 22 in the detection system of reflected light of the back light, as shown in FIG. 8 and FIG. 9(A), the light A to be detected by the back light 27 passes through the polarizing filter 28, TFT substrate 24, liquid crystal layer 26, opening BMSK221 of the black mask BMSK22 of the light receiving cell 22 arranged at a predetermined position (coordinate position), counter substrate 25, and polarizing filter 29 in the effective pixel area portion 2 and is reflected at a body to be detected of a user (for example, finger) arranged on the front surface side 252 of the counter substrate 25.

This reflected light A passes through the polarizing filter 29, counter substrate 25, and liquid crystal layer 26, and is received at an active region (channel region) of a light receiving element (photo sensor) 221 formed by, for example, a TFT through the opening BMSK221 of the black mask BMSK22 of the light receiving cell 22, to output the received signal as a photo current.

In the light receiving cell 22, as the light from the back light 27, other than the light to be detected A, there are a noise beam B1 which is reflected at, for example, an interface region between the flattening film 313 and the liquid crystal layer 26 and strikes the light receiving element 221, and a noise beam B2 which directly strike the light receiving element 221. Namely, the output signal of the light receiving cell 22 includes the light A to be detected and the noise beams B1 and B2.

Since, in the reference cell 23, the opening BMSK221 of the black mask BMSK22 of the light receiving cell 22 is not formed, the light by the back light 27, does not form the light A to be detected, and includes, for example, the noise beam B1 which is reflected at the interface region between the flattening film 313 and the liquid crystal layer 26 and strikes the light receiving element 221 and the noise beam B2 which directly strikes the light receiving element 221. Namely, the output signal of the light receiving cell 22 includes the noise beams B1 and B2.

Note that the illustration shows the case where the noise beam B2 directly passes through the gate electrode of the TFT and directly strikes the channel region, however, in actuality, since the gate electrode of the bottom gate type TFT is formed on the optical path of the back light beam to the channel region of the TFT, this illustration shows that the light is reflected here, the reflected light travels the periphery around the gate electrode to likely become the noise beam B2.

Accordingly, in the received light signal processing circuit 6 (6A), the differential signal processing (differential processing) of the output signal of the light receiving cell 22 and the output signal of the reference cell 23 adjacent to the light receiving cell 22 is performed at the operational amplifier 62, and the most of the noise component can be deleted.

As a result, the output of the operational amplifier 62 is a signal with the influence of reflection noise and offset noise in the light receiving cell 22 suppressed extremely small.

As explained above, according to the present embodiment, since the apparatus has the plurality of display cells 21 having display circuits 210, the light receiving cell 22 including the light receiving element 221, the reference cell 23 having a configuration equivalent to that of the light receiving cell and blocked from incidence of the light upon the light receiving element 221, and the received light signal processing circuit 6 performing the differential signal processing of the output signal of the light receiving cell 22 and the output signal of the reference cell 23, the following effects can be obtained.

In a system realizing a touch panel and image sensor etc. by utilizing the reflected light from light of a back light as the light to be detected, internal reflected light noise in the layer located lower than the black mask can be deleted, and a high SN ratio can be realized.

In the system using the above back light or an imaging system using external light, offset noise of the light receiving elements (photo sensor) and pixel circuits can be deleted, therefore a high SN ratio can be realized.

In the system using the above back light or an imaging system using of external beam, interference noise from the display can be deleted, therefore a high SN ratio can be realized.

The noise described above can be deleted in real time, therefore a high reliability system can be realized, without the influence of a change in the temperature characteristic and fluctuation of the characteristics due to the elapse of time.

For the same reasons as those described above, a calibration operation when turning on the power, becomes unnecessary.

Note that, in the above embodiment, as the cell array of the effective pixel area portion 2, an explanation was given with reference to the case where an array where the R color display cell 21R, the G color display cell 21G, and the B color display cell 21B are arranged, the light receiving cell 22 is arranged adjacent to the display cell 21B, following this light receiving cell 22, the R color display cell 21R, the G color display cell 21G and the B color display cell 21B are arranged, and the reference cell 23 is arranged adjacent to the display cell 21B is defined, as a first group, and this first group is periodically repeatedly formed.

The present invention is not limited to this formation of an array. Various modifications are possible.

For example, as shown in FIG. 10, it is possible to adopt a configuration in which a group adjacent to the first array (group) explained above is formed as a second array (group) which is provided with a merely black mask BMSK (BM) in the arrangement region of light receiving cells and reference cells, and the reference cells and/or light receiving cells formed under a black mask BMSK (BM) to which an external portion is not connected, and these first group and second group are alternately arranged, or a plurality of the second groups are continuously arranged, or, a plurality of the first groups are continuously arranged and the second groups are arranged.

Further, although not shown, a configuration in which the light receiving cell 22 and the reference cell 23 are directly adjacent to each other, can be adopted.

Further, it is also possible to configure so as to provide one reference cell 23 in each unit where a plurality of groups are defined as a unit, and in that unit, to carry out the differential signal processing of the output signal of each light receiving cell 22 and the output signal of that one reference cell 23.

Alternatively, it is also possible to configure so as to provide one reference cell in the entire effective pixel area portion 2, and to carry out the differential signal processing of the output signal of each light receiving cell 22 and the output signal of that one reference cell 23.

Note that, as shown in FIG. 2, it can be configured so as to arrange one light receiving element for a plurality of pixels, or so as to arrange one light receiving element for each of R, G, and B, or so as to arrange one light receiving element for one pixel.

The arrangement of the light receiving elements in the display apparatus when applying the present invention will not be particularly limited. In this way, by applying the present invention to a display apparatus having built-in light receiving elements as shown in FIG. 2, it becomes possible to use a light reception signal which is little influence of noise in the post-processing, and it becomes possible to perform the light reception (imaging) processing while preventing entry of a display side signal into an imaging side signal.

The invention claimed is:

1. A display apparatus comprising:
at least one display cell having a display circuit;
at least one light receiving cell including a light receiving element;
at least one reference cell having a configuration substantially equivalent to a configuration of the light receiving cell and having a shield structure that blocks light from the light receiving element of the reference cell; and
a signal processing circuit performing differential signal processing of an output signal of the light receiving cell and an output signal of the reference cell, and further wherein the display apparatus is comprised of a plurality of the display cells arranged in a matrix and a plurality light receiving cells and reference cells mixed within the matrix of light receiving cells, and further wherein there are a plurality of light receiving cells and reference cells and a black mask is provided as a layer above the light receiving cells and the reference cells with an opening in the black mask for the light receiving cells and further wherein each pair of a plurality of adjacent light receiving cells and reference cells have an output connected directly to an input of an operational amplifier of the signal processing circuit such that each operational amplifier has an input from a reference cell and a light receiving cell.

2. A display apparatus as set forth in claim 1, wherein, in the effective pixel area portion,
the light receiving cell is arranged close to at least one first display cell,
at least one second display cell is arranged adjacent to the light receiving cell, and
an arrangement pattern on which the reference cell is arranged close to the arranged second display cell is periodically repeated.

3. A display apparatus as set forth in claim 1, wherein:
the effective pixel area portion comprises:
a first arrangement system in which the light receiving cell is arranged close to at least one first display cell, at least one second display cell is arranged close to the light receiving cell, and the reference cell is arranged close to the arranged second display cell; and a second arrangement system in which a first dummy cell from which an output cannot be extracted is arranged close to at least one third display cell, at least one fourth display cell is arranged adjacent to the first dummy cell, and a second dummy cell from which an output cannot be extracted is arranged close to the arranged fourth display cell.

4. A display apparatus as set forth in claim 3, wherein:
the first arrangement system and the second arrangement system are adjacent and are arranged so as to be periodically repeated.

5. A display apparatus as set forth in claim 1, wherein:
in the light receiving cell, an opening guiding light to be detected to the light receiving element is formed in a light shield mask, and
the reference cell is blocked from incidence of the light to be detected.

6. A display apparatus as set forth in claim 1, wherein:
the signal processing circuit performs differential signal processing of output signals between the light receiving cell and the reference cell arranged close to each other.

* * * * *